United States Patent
Walles et al.

[11] Patent Number: 5,925,298
[45] Date of Patent: Jul. 20, 1999

[54] METHOD FOR REWORKING A MULTI-LAYER CIRCUIT BOARD USING A SHAPE MEMORY ALLOY MATERIAL

[75] Inventors: Bethany Joy Walles, Birmingham; Michael George Todd, South Lyon; Robert Edward Belke, Jr., West Bloomfield, all of Mich.

[73] Assignee: Ford Motor Company, Dearborn, Mich.

[21] Appl. No.: 08/494,509

[22] Filed: Jun. 26, 1995

[51] Int. Cl.[6] .......................... B32B 31/00; B29C 41/00; B29C 37/02; B28B 7/30
[52] U.S. Cl. .......................... 264/139; 264/138; 264/230; 264/DIG. 4; 264/DIG. 66; 264/295; 264/296; 264/313; 264/322
[58] Field of Search .................................. 264/138, 139, 264/230, 231, 163, DIG. 4, DIG. 66, 296, 313, 322, 295

[56] References Cited

U.S. PATENT DOCUMENTS

| | | | |
|---|---|---|---|
| 2,998,475 | 8/1961 | Grimsinger | 174/68.5 |
| 3,255,299 | 6/1966 | Hartsock | 174/68.5 |
| 4,110,396 | 8/1978 | Reynolds | 264/230 |
| 4,621,882 | 11/1986 | Krumme . | |
| 4,769,199 | 9/1988 | Bemis et al. | 264/139 |
| 4,841,100 | 6/1989 | Ignasiak . | |
| 4,899,543 | 2/1990 | Romanelli et al. | 60/527 |
| 5,044,980 | 9/1991 | Krumme et al. . | |
| 5,151,152 | 9/1992 | Kaeufe et al. | 264/163 |
| 5,486,324 | 1/1996 | Klein, Jr. | 264/138 |

FOREIGN PATENT DOCUMENTS

| | | | |
|---|---|---|---|
| 2541932 | 9/1984 | France | 264/138 |
| 3826429 | 2/1990 | Germany | 264/230 |
| 6080768 | 3/1994 | Japan | 264/230 |

*Primary Examiner*—Jan H. Silbaugh
*Assistant Examiner*—Robin S. Gray
*Attorney, Agent, or Firm*—Joseph W. Malleck

[57] ABSTRACT

A method and apparatus for forming a rigid circuit board has a circuit board with a reduced thickness in a bend region. The bend region may have several layers of laminate and conductive material. The circuit board is heated to the glass transition temperature which allows the circuit board to become flexible. The apparatus has a clamping member and a stationary member. The clamping member uses a shape memory alloy actuator with a transition temperature about the same as the glass transition temperature of the laminate. The actuator is used to form the bend region to a predetermined shape around the stationary member. When the circuit board is cooled, the circuit board again becomes rigid in its predetermined shape.

10 Claims, 3 Drawing Sheets

1

METHOD FOR REWORKING A MULTI-LAYER CIRCUIT BOARD USING A SHAPE MEMORY ALLOY MATERIAL

BACKGROUND OF THE INVENTION

The present invention relates generally to the manufacture of printed circuit boards and, more specifically, to a method for forming a folded rigid circuit board.

Space constraints are a significant burden in the designing of electronic modules. Electronic circuit designers have a continual need to provide an increasing amount of circuitry in a smaller amount of space.

One way to reduce the package size of a module is to mount portions of the circuit opposite each other within the module. Mounting a circuit board in this manner may be accomplished in several ways.

One way to construct such a module is to manufacture the circuit traces on a flexible film such as a polyimide film or polyester substrate film. The film is bent to fit within the module. Such films, however, have a relatively high cost and are not well suited for high temperature processing techniques desirable for high volume production. Another drawback is that circuit traces are limited to a single thickness making the routing of such traces difficult in intricate circuit designs.

Another technique is to manufacture two separate rigid circuit boards and inter connect them with a flexible film portion. One drawback to this configuration is that connectors must be provided at the rigid/flexible circuit board interface. Another drawback is that circuit traces in the flexible portion are limited to a single thickness. Yet another drawback to such a system is that the circuit boards typically are manufactured in one location and populated in another location. The circuit boards are populated in separate locations and must then both be relocated to a further location to be interconnected in the module, thereby adding to the complexity of the manufacturing process.

Another packaging technique is to bend a circuit board as described in U.S. Pat. No. 3,255,299. In this patent, a circuit board having one conductive layer is cut thinly in one region and bent only ninety degrees. The circuit board is cut so thin that the board becomes flexible. Such a circuit board is not adapted to unbending or rebending. These would result in separating the conductor from the substrate. Unbending is a desirable feature since circuit boards are commonly reworked to cure defects. The design shown in this patent is also limited to one layer of conductive material in the thinly cut area.

It would therefore be desirable to have a circuit board with multilayers of traces capable of flexing in a region capable of repeated bending.

SUMMARY OF THE INVENTION

One advantage of the present invention is that the circuit board can be populated and bent as integral steps in a continuous manufacturing line.

Another advantage of the present invention is that the circuit board can be reworked without reducing the reliability of the circuit board.

In the present invention a circuit board is clamped between a stationary member and a shape memory alloy actuator. The shape memory alloy actuator having a transition temperature of at least the glass transition temperature of the circuit board. The circuit board is heated to the glass transition temperature and bent at a predetermined area to a predetermined shape using forces from the shape memory alloy actuator. When cooled the circuit board is rigid and retains a predetermined shape.

DETAILED DESCRIPTION OF THE PREFERRED EMBODIMENT

Figure 1:
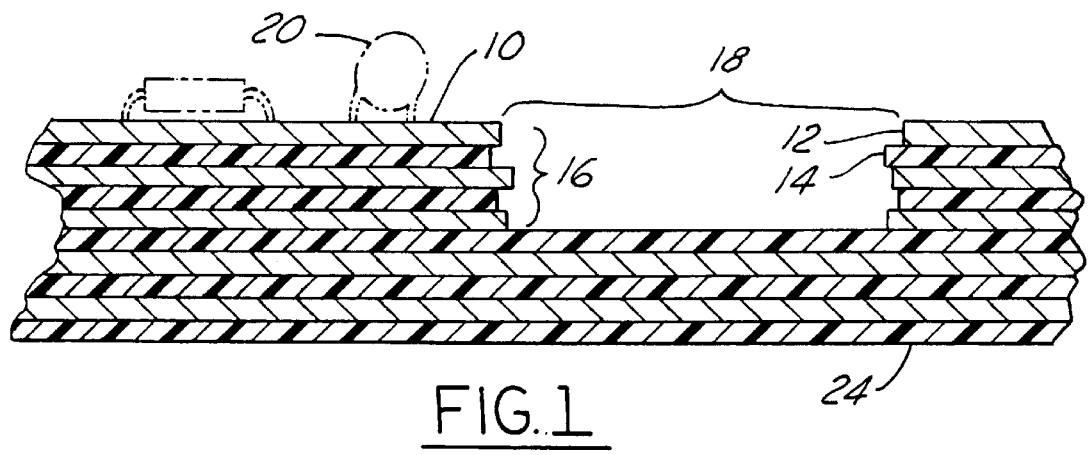
FIG. 1 is a cross section of a multilayer circuit board having an area of reduced cross section.

Referring to FIG. 1, a circuit board 10 has several alternating layers of conductive traces 12 and laminate 14. Conductive traces 12 are made from an electrically conductive material such as copper. Laminate 14 is an electrically insulative circuit board material such as FR4 which is a flame-retardant epoxy-glass fabric composite resin. Laminate 14 becomes flexible upon the application of relatively high temperatures, i.e., a thermoplastic or thermoset materials are used and the glass transition temperature ($t_g$) of the material is exceeded, resulting in elastomeric mechanical behavior.

A groove 16 is cut into circuit board 10 to form a bend region 18. Groove 16 is preferably machined conventionally by using a carbide endmill, fly cutter, or similar tool. Machining preferably is performed before circuit board 10 is populated with electrical components 20. When circuit board 10 undergoes bending as described below the top surface, as illustrated, is a compression side 22, whereas the bottom surface is a tension side 24. Machining is preferably performed on compression side 22. Conductive traces 12 are located within circuit board 10 in a manner so that they are undisturbed during the machining process. A common circuit routing program may be used to route conductive traces 12 preferentially toward tension side 24, for example.

Groove 16 is cut deep enough to allow bending under elevated temperatures as further described below while keeping circuit board 10 rigid at ambient temperatures during population with electrical components, testing and shipment. The thickness in bend region 18 after cutting of groove 16 is typically below 25 mils. The width of bend region 18 will vary depending on the thickness of the remaining material in bend region, the number of layers of conductive traces 12, and the amount circuit board 10 will be bent.

Figure 2A:
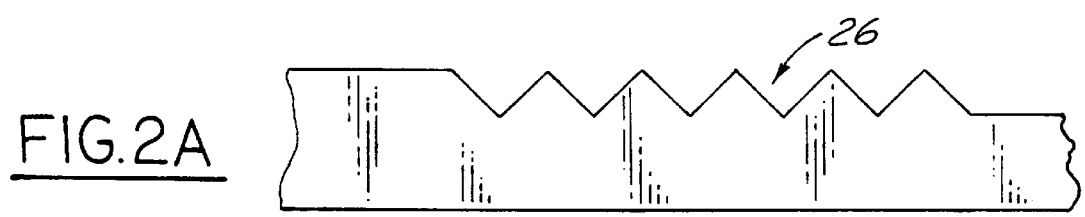
FIGS. 2a and 2b are alternative groove patterns from that shown in FIG. 1.
Figure 2B:
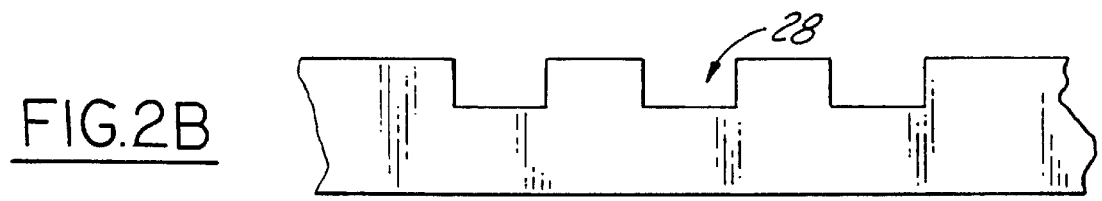

Referring now to FIG. 2, the shape of groove 16 is not limited to being rectangular as shown in FIG. 1. Groove 16 may also be comprised as a series of V-grooves 26 as shown in FIG. 2a. Groove 16 may also be formed of a series of rectangular-shaped grooves 28 as shown in FIG. 2b.

Figure 3:
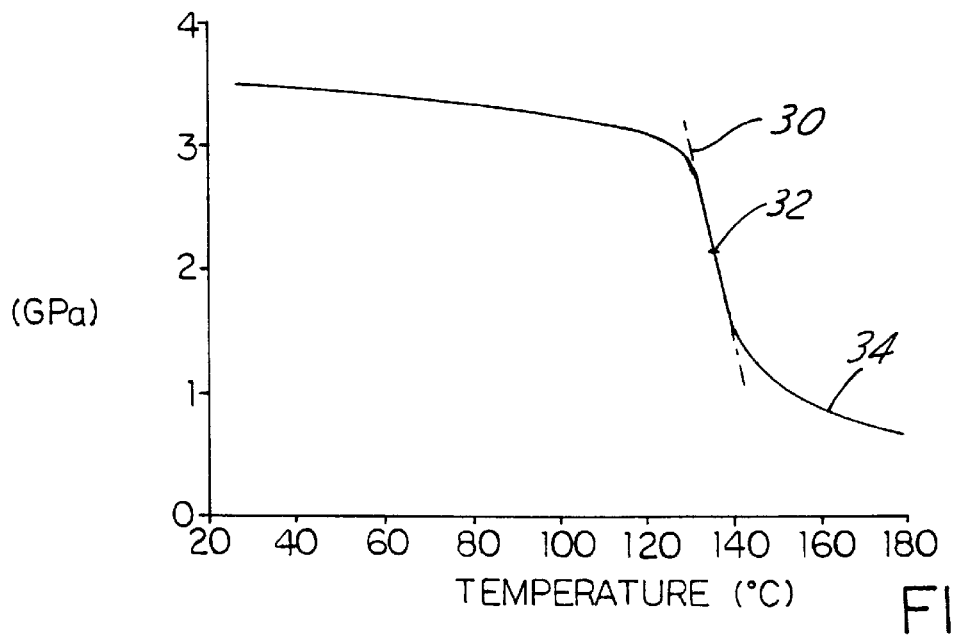
FIG. 3 is a plot of pressure versus temperature plot of FR4 circuit board material.

Referring now to FIG. 3, a plot of the shear storage modulus (in gigapascals) as a function of temperature (centigrade) for laminate material FR4 is shown. Bending of circuit board 10 is performed when bend region 18 is heated above the glass transition temperature of laminate 14. Several close temperature points on the plot may be identified as the glass transition temperature points. Point 30 is called the onset glass transition temperature which is where laminate starts to become flexible. Point 32 is called the inflection glass transition temperature. Point 33 is a temperature when the laminate acts as an elastomer. While bending can occur at either the onset or inflection temperature, it is preferred that bending occur when the circuit board is the most flexible i.e., when the board acts as an elastomer. Laminate acts as an elastomer at temperatures above those at point 33 which is about 160° C.

Referring now to FIGS. 4A–D, the bending of circuit board 10 is preferably performed as an integral step in a continuous assembly process. Circuit board 10 is machined in the bend area to a thickness to allow bending when heated but otherwise remain rigid. After circuit board 10 is populated and soldered as part of a continual assembly process, circuit board 10 is placed into a bending apparatus 34. Bending apparatus 34 has a stationary member 36, a clamping member 38 and a heater 42.

Stationary member 36 and a clamping member 38 are used to hold bend region 18 during bending. Circuit board 10 may be heated locally through heat generated by stationary member 36 and clamping member 38. Heat may also be generated by an environmental heater 42 such as an oven or other heating unit.

Clamping member 38 carries a shape memory alloy actuator 40 used to contact and bend circuit board 10. Actuator 40 is preferably formed of two straps of a commonly known shape memory alloy such as an NiTi based alloy. A shape memory alloy is a material which has the ability to "remember" a shape after deformation. Once these materials are shaped at low temperatures (the martensitic phase), they remain so formed until reaching a transformation temperature (the austenitic phase). During heating the shape memory alloy will return to its original pre-deformed shape. The shape memory alloy contents are preferably adjusted so that actuator 40 bends at the glass transition temperature of laminate layer 14.

Figure 4A:
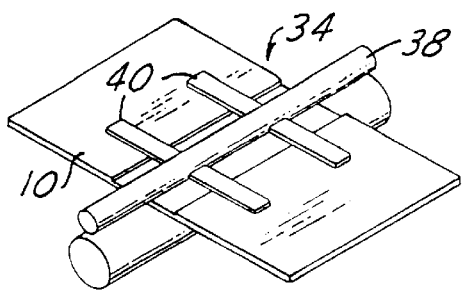
FIGS. 4A–D show an apparatus for bending a circuit board according to one method of practicing the present invention.

In FIG. 4A circuit board 10 is clamped between stationary member 36 and clamping member 38 at an ambient temperature of around 20° C.

Figure 4B:
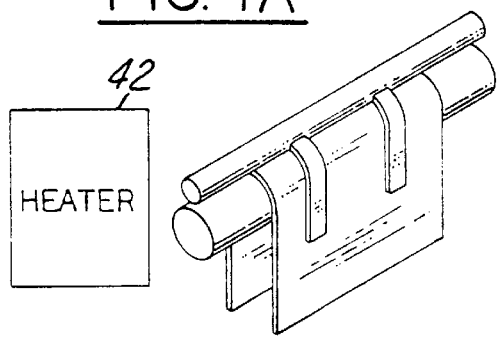
Figure 5B:
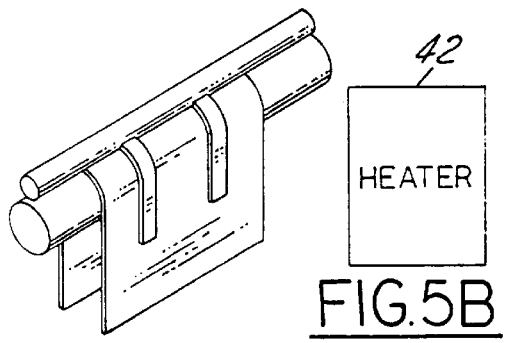

In FIG. 4B, bending apparatus 34 is heated to the glass transition temperature of laminate layer 14 which is also preferably the transformation temperature of the shape memory alloy. This temperature causes shape memory alloy actuators 40 to revert to their bent state, thereby forcing circuit board 10 to bend to its desired shape.

Figure 4C:
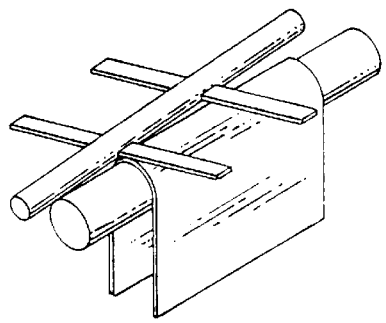

In FIG. 4C, the bending apparatus is cooled. Actuators 40 revert to their ambient temperature shape, i.e., an open position, while circuit board 10 cools to a rigid state in its bent form.

Figure 4D:
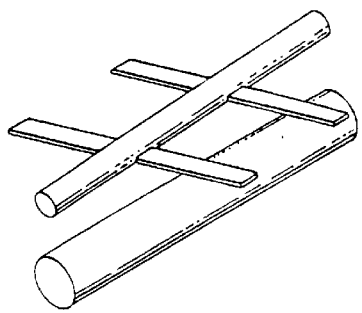

In FIG. 4D, circuit board 10 is removed from bending apparatus 34. Bending apparatus 34 is then ready for reuse.

In FIG. 5, an alternative embodiment is shown wherein a different type of shape memory alloy is used. When this type shape memory alloy is cooled, it does not revert back to its original shape during cooling.

Figure 5A:
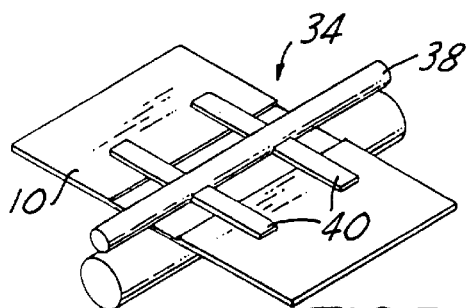
FIGS. 5A–D show an apparatus for bending a circuit board according to an alternative method for practicing the present invention.

FIGS. 5A and 4B are identical to FIGS. 4A and B in that when circuit board 10 is clamped in place in 5A and heated in 5B, straps 40 bend circuit board 10 to the desired shape.

Figure 5C:
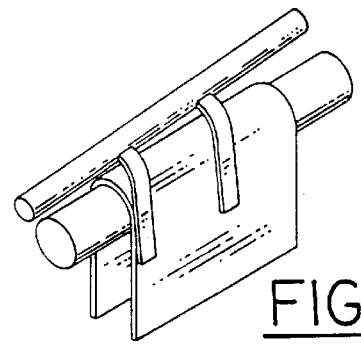

In FIG. 5C, the shape memory alloy does not return to its unbent shape when cooled. Clamping member 38 is separated from stationary member 36 and circuit board 10 is removed.

Figure 5D:
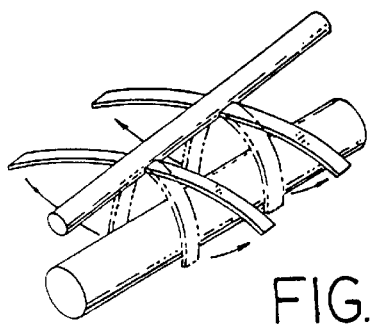

In FIG. 5D, shape memory alloy actuator 40 is physically rebent to the open position. The process of FIG. 5 may then be performed again.

Figure 6:
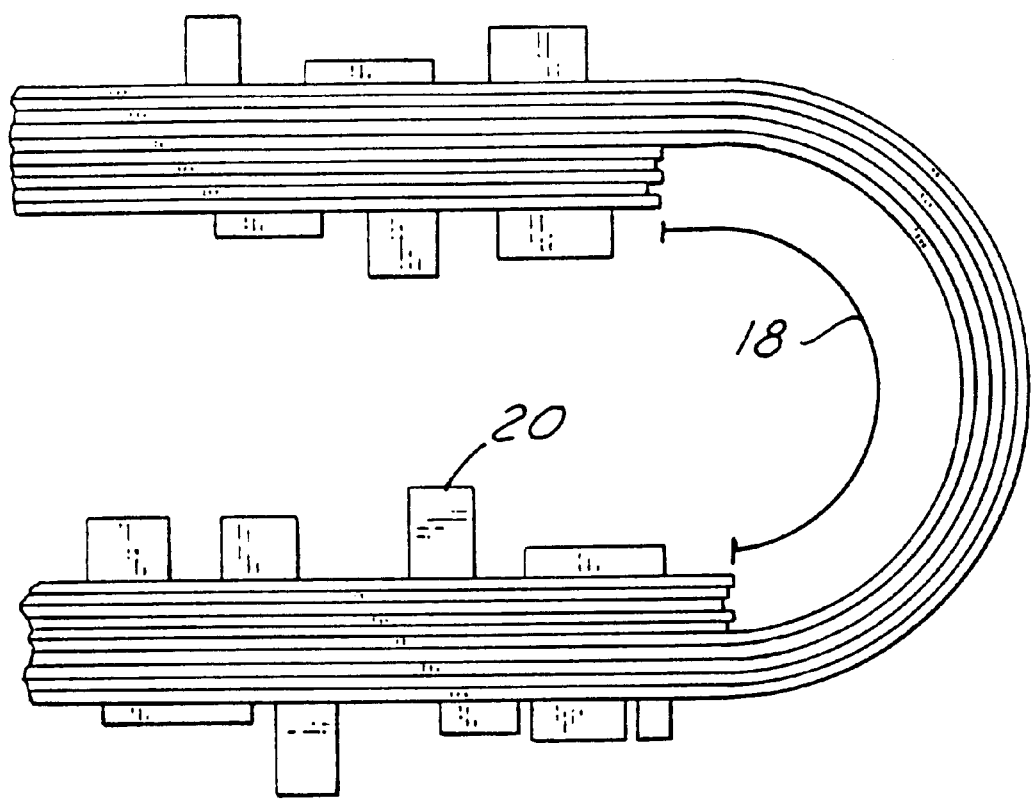
FIG. 6 is a circuit board bent according the present invention.

Referring now to FIG. 6, after circuit board 10 is bent by force from actuators 40, heat is removed from circuit board 10. When circuit board 10 is cooled, it again becomes rigid retaining its desired shape. If rework is desired, circuit board 10 may be easily reheated in bend region 18 and unbent for access to components 20.

The present invention is intended to include modifications which would be apparent to those skilled in the art. For example, different laminate materials, or a different number of layers of conductor and laminate may be used.

What is claimed is:

1. A process of reworking a rigid multi-layer circuit board having a first thickness and made of a plastic material with a glass transition temperature, comprising the steps of:

clamping said circuit board between and in contact with a stationary member and a deformed shape memory actuator, said deformed shape memory actuator having a transformation temperature of at least said glass transition temperature of said plastic material;

heating said circuit board and said deformed shape memory actuator to said transformation temperature to cause said deformed shape memory actuator to return to an original pre-deformed shape and thereby bend said heated circuit board at a selected area with forces from said deformed shape memory actuator to provide said heated circuit board with a bent shape;

then cooling said circuit board so that said circuit board is rigid and retains said bent shape; and removing and separating said shape memory actuator from said bent circuit board.

2. The method of reworking a rigid circuit board as recited in claim 1 further comprising the step of reducing the thickness of said circuit board in said selected area prior to said bending to facilitate said bending.

3. The method of reworking a rigid circuit board as recited in claim 2 wherein said bent circuit board has a tension side and a compression side;

wherein said step of reducing said thickness is comprised of cutting a groove on said compression side of said circuit board prior to said bending.

4. The method of reworking a rigid circuit board as recited in claim 1 wherein said clamped circuit board has at least two layers of conductive material;

and said selected area has at least two layers of said conductive material.

5. A method for reworking a rigid multi-layer circuit board having a first thickness and being made of a plastic material having a glass transition temperature, comprising the steps of:

providing a clamp having a curved surface and a deformed shape memory actuator having a transformation temperature of at least said glass transition temperature of said plastic material;

securing said circuit board to said clamp at a selected area of said circuit board;

placing said deformed shape memory actuator against said secured circuit board;

heating said secured circuit board and said deformed shape memory actuator to said transformation temperature to cause said deformed shape memory actuator to return to an original pre-deformed shape and thereby bend said heated circuit board at said selected area to a bent shape;

then cooling said bent circuit board to a rigid state thereby retaining said bent shape; and releasing and separating said cooled circuit board from said shape memory actuator.

6. The method of reworking a rigid circuit board, as recited in claim 5, further comprising the step of reducing said first thickness of said circuit board in said selected area prior to said bending to facilitate said bonding.

7. The method of reworking a rigid circuit board as recited in claim 5 wherein said bent circuit board has a tension side and a compression side;

wherein said step of reducing said thickness is comprised of cutting a groove on said compression side of said circuit board prior to said bending.

8. The method of reworking a rigid circuit board, as recited in claim 5, wherein said circuit board has at least two layers of conductive material;

and said selected area has at least two layers of said conductive material.

9. The method of reworking a rigid multilayer circuit board as recited in claim 5 further comprising the steps of:

cooling said shape memory actuator to return said shape memory actuator from said pre-deformed shape to said deformed shape.

10. A method for reworking a multi-layer circuit board to a bent shape to form a rigid multi-layer circuit board, said circuit board being made of a plastic material having a glass transition temperature; comprising the steps of:

(a) placing an unbent circuit board in juxtaposition to a deformed shape memory actuator having a transformation temperature of at least said glass transition temperature of said plastic material to thereby form an assembly;

(b) heating the assembly to at least the transformation temperature to cause said deformed shape memory actuator to return to an original pre-deformed shape and thereby bend the circuit board to achieve a bent multi-layer circuit board;

(c) cooling the heated assembly to allow the bent circuit board to become rigid;

(d) separating said pre-deformed shape memory actuator from said bent circuit board; and (e) unbending said bent circuit board.

* * * * *